United States Patent [19]

Novak et al.

[11] 4,067,042
[45] Jan. 3, 1978

[54] HEAT SINK MECHANISM HYDRAULICALLY PROPELLED INTO CONTACT WITH SEMICONDUCTOR DEVICES

[75] Inventors: Petr Novak; Michal Pellant; Pavel Reichel, all of Prague, Czechoslovakia

[73] Assignee: CKD Praha, oborovy podnik, Prague, Czechoslovakia

[21] Appl. No.: 721,377

[22] Filed: Sept. 8, 1976

[30] Foreign Application Priority Data

Sept. 8, 1975   Czechoslovakia ................... 6085/75

[51] Int. Cl.² .................... H01L 25/04; H01L 23/48; H01L 29/40
[52] U.S. Cl. ........................................ 357/82; 357/65; 165/80; 165/105; 174/16 B
[58] Field of Search ...................... 357/82, 65; 165/80, 165/105; 174/16 B

[56] References Cited

U.S. PATENT DOCUMENTS

| | | | |
|---|---|---|---|
| 3,307,087 | 2/1967 | Rogers et al. .......................... | 357/82 |
| 3,649,738 | 3/1972 | Andersson ............................. | 357/82 |
| 3,703,668 | 11/1972 | Bylund et al. ........................ | 357/82 |
| 3,812,404 | 5/1974 | Barkan et al. ........................ | 357/82 |
| 3,852,803 | 12/1974 | Walmet et al. ........................ | 357/79 |
| 3,991,396 | 11/1976 | Barkan .................................. | 357/82 |
| 3,993,123 | 11/1976 | Chu et al. ............................. | 357/82 |

Primary Examiner—Andrew J. James

[57] ABSTRACT

An arrangement including a hydraulic chamber for simultaneously regulating the contact pressure on a plurality of heat sinks associated with planar semiconductor devices to be cooled is described. A corresponding plurality of elongated rods coupled at their outer ends to one surface of each of the heat sinks extend outwardly through aligned holes in a boundary wall of the chamber. A plunger or other suitable device extends into the chamber through a second opening therein to vary the pressure on the compressible medium and thereby to urge the heat sinks against the associated semiconductive elements with a uniform pressure. Facilities are provided for electrically deactivating the semiconductive elements when the pressure within the chamber falls below a predetermined value.

8 Claims, 6 Drawing Figures

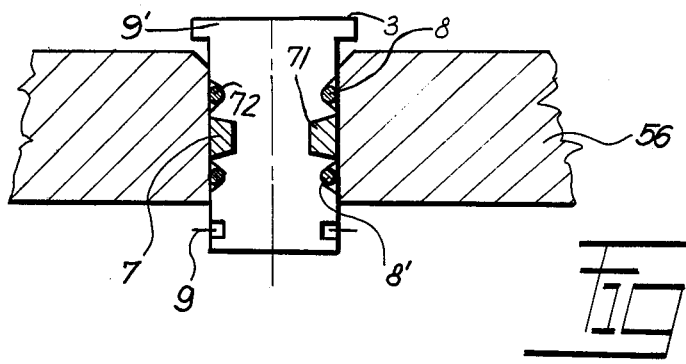
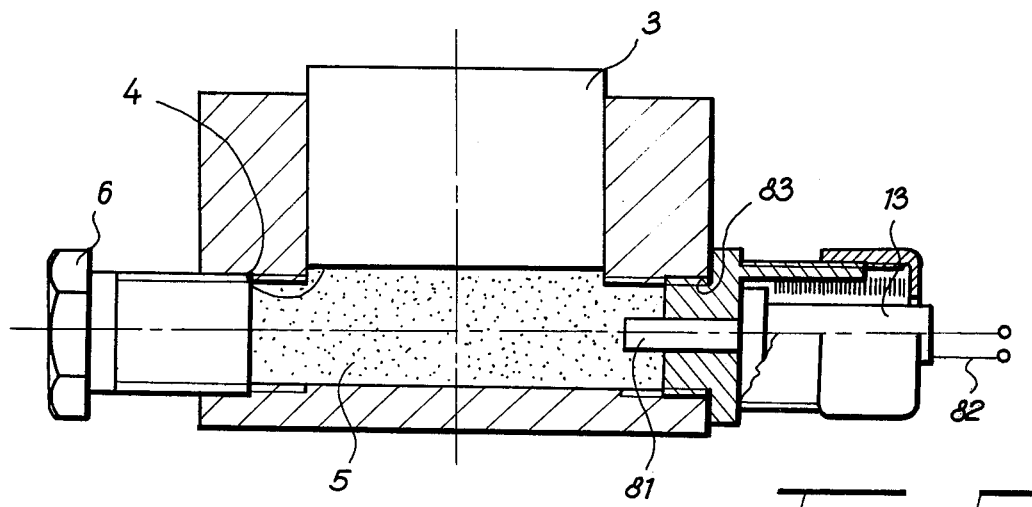
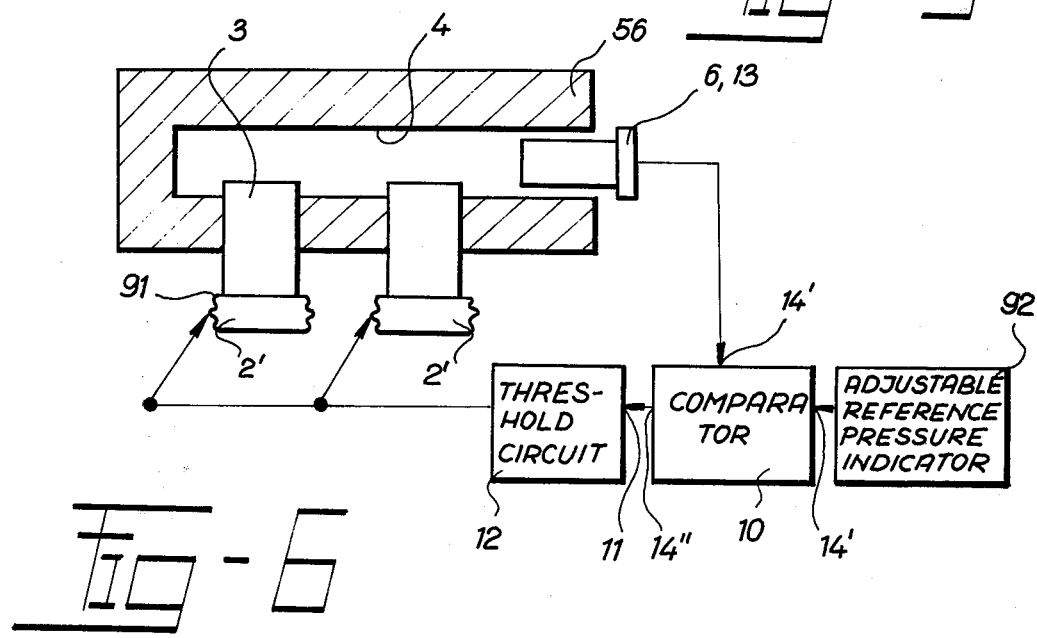

HEAT SINK MECHANISM HYDRAULICALLY PROPELLED INTO CONTACT WITH SEMICONDUCTOR DEVICES

BACKGROUND OF THE INVENTION

The invention relates to arrangements for simultaneously cooling a plurality of planar semiconductor devices.

In one known arrangement of this type, which is adapted to force a plurality of heat sinks against associated ones of the semiconductive elements with a constant contact pressure, the heat sinks are associated with a pair of chambers which support mutually opposed systems of rods individually associated with the heat sinks. Hydraulic pressure in one of the chambers, which is made variable by a piston or other suitable element extending therein, is transmitted to the other chamber and to both systems of rods, which in turn are suitably coupled to the heat sinks and the semiconductive elements.

Such systems have the disadvantage of being complex and expensive. In addition, special and highly efficient seals are necessary between the systems of rods and the associated openings in the walls of the corresponding chambers.

SUMMARY OF THE INVENTION

Such disadvantages are overcome by the contact-type cooling system constructed in accordance with the invention. In an illustrative embodiment, only a single chamber is used, such system being filled with a hydraulically compressible medium. A single set of rods, individual to the semiconductive elements to be cooled, extend through aligned openings in a boundary wall of the chamber, with the outer ends of the rods being resiliently coupled to the surfaces of the heat sinks opposite to the semiconductor elements. Simple and conventional expedients, such as O-rings or corrugated metal inserts, are sufficient to provide adequate sealing between the outer periphery of each rod and the surrounding inner periphery of the chamber wall opening.

A plunger extending into the chamber is arranged to vary the pressure thereof, which in turn is translated into variations in contact pressure of the rods against the heat sink and semiconductor elements. If desired, a pair of limit stops may be individually connected to the inner and outer ends of each rod to establish the boundaries of axial travel.

Electrical excitation for the semiconductive elements may be applied directly through the heat sinks. Where the semiconductive elements are regulatable devices having a control electrode, a feature of the invention is the provision of facilities for decoupling excitation from the control electrodes thereof when the hydraulic pressure within the chamber, and thereby the uniform contact pressure applied through the rods to the heat sinks, falls below a predetermined value. Illustratively, a transducer extends into the chamber for generating a first signal indicative of the actual value of chamber pressure, such first signal being applied to a first input of a comparator circuit. The second input of the comparator is excited by a reference signal indicative of the desired value of pressure. When the actual value of pressure exceeds the reference value, the state of a threshold-operated switch is reversed to remove excitation from the control electrode of the semiconductive element. This feature provides effective "fail-safe" operation of the elements in the event that insufficient cooling (which is proportional to the degree of contact pressure) falls below a minimum acceptable value.

BRIEF DESCRIPTION OF THE DRAWING

The invention is further set forth in the following detailed description taken in conjunction with the appended drawing, in which:

FIG. 4 is a representation illustrating a second manner of sealing the rod to the surrounding periphery of the opening in the chamber wall, together with facilities including liquid metal for providing conduction between the boundary wall of the chamber and the rod;

FIG. 5 is a representation illustrating the manner in which hydraulic pressure in the chamber of FIG. 1 is varied, and in which such pressure in the chamber may be continually monitored; and FIG. 6 is a representation of a semiconductive element-cooling arrangement similar to FIG. 1, including additional facilities for decoupling excitation from the semiconductive elements when the pressure inside the chamber, and thereby the cooling efficiency of the rods, fall below a predetermined value.

DETAILED DESCRIPTION

Figure 1:
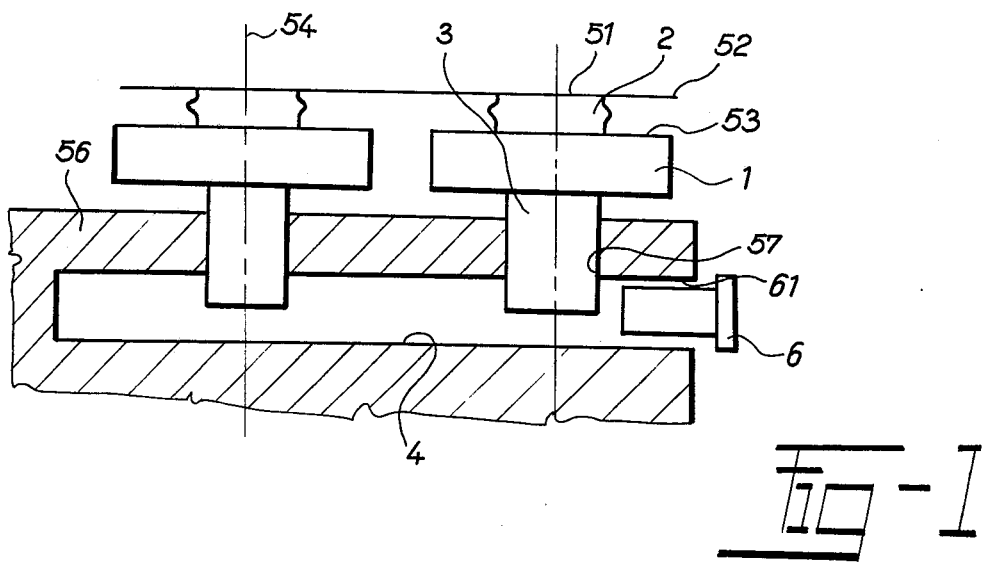
FIG. 1 is a schematic representation of a contact-type arrangement in accordance with the invention for cooling a plurality of semiconductive elements, two of which are illustrated.

Referring to the drawing, FIG. 1 depicts, in abbreviated form, an arrangement for cooling a plurality (illustratively 2) of planar semiconductor devices 2.

Outer surfaces 51 of the devices 2 are assumed to be suitably secured within a chassis, represented schematically by a surface 52. The opposed planar surfaces of the respective devices 2 are engageable with a first surface 53 of an associated one of a plurality of heat sinks 1, whose outer surfaces are coupled to the outer ends of respective ones of a plurality of rods 3.

Each of the rods 3, which like the heat sinks 1 are assumed to be formed of a conductive material, extend outwardly from a first boundary wall 56 of a chamber 4, which is assumed to be filled with a liquid or semi-liquid hydraulic medium. For this purpose, the rods 3, together with the heat sinks 1 associated with their outer ends, are mounted for slidable movement in the direction of longitudinal axes 54 within a corresponding plurality of aligned openings 57 in the chamber boundary wall 56. With this arrangement, increments in pressure applied to the medium filling the chamber 4 cause each of the rods 53 to be pressed outwardly of the wall 56 with equal increments of pressure, thereby assuring a constant pressure contact of the heat sinks 1 with the associated surfaces of the planar semiconductor devices 2 irrespective of differences in construction of or tolerances between such devices.

Figure 2:
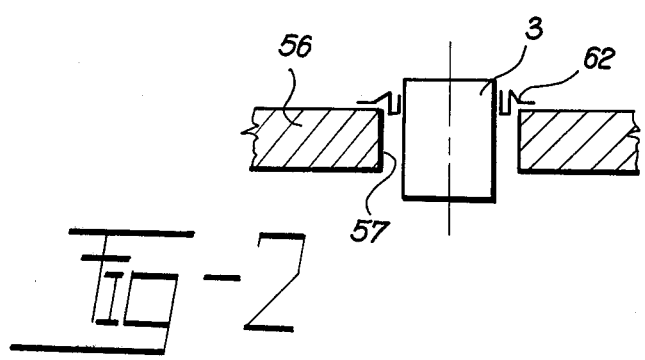
FIG. 2 is a representation illustrating one manner of sealing a movable rod used in the arrangement of FIG. 1 with the surrounding periphery of an opening in a hydraulic chamber.

A piston-like member 6 is extendable into the chamber 4 through an additional opening 61 to vary the pressure within the chamber and thereby the contact pressure of the heat sinks 1 on the devices 2. In order to prevent the hydraulic medium within the chamber 4 from escaping to the outside of the wall 56 through the openings 57, suitable conventional seals 62 (FIG. 2), illustratively in the form of corrugated metal sleeves, are interposed between the outer periphery of each rod 3 and the surrounding periphery of each of the openings 57.

Figure 3:
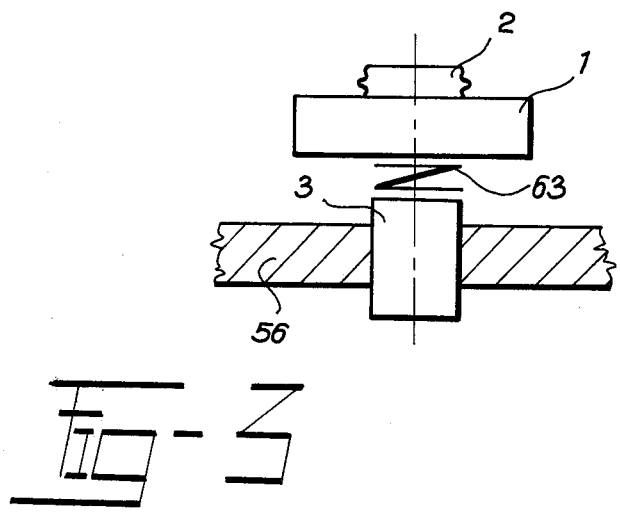
FIG. 3 is a representation depicting one manner of resilient connection between the outer end of the rod of FIGS. 1 and 2 with a heat sink affixed to a semiconductive device to be cooled.

The heat sink 1 may be coupled to the outer end of the associated rod 3 through a suitable elastic element 63 (FIG. 3), which may be made of conductive material. If desired, a suitable separate flat conductor may be interposed between the heat sink 1 and the rod 3 in conductive relation therewith for providing electrical excitation to the device 2; alternatively, electrical excitation for the device 2 may be provided through only the heat sink 1 itself. As still another alternative, which is useful when the wall 56 of the chamber 4 is of conductive material, is depicted in FIG. 4; in this case, the required contact between the walls 56 and the conductive material of the rod 3 is obtained by a filling 7 of liquid metal, which is disposed within a first annular groove 71 centrally located in the rod 3. In order to prevent escape of the metal 7, as well as to prevent hydraulic liquid from the interior of the chamber 4 from escaping through the wall 56, the rod 3 may further be provided with a pair of annular recesses 72 respectively disposed on opposite sides of the recess 71. A pair of sealing rings 8, 8' are respectively disposed in recesses 72.

In order to restrict the axial movement of the rods 3 in response to variations in pressure inside the chamber 4, the inner end of each rod 3 is provided with a limit stop 9 extending radially outward from the outer periphery of the rod. Similarly, the outer end of the rod 3 may be provided with a corresponding limit stop (in the form of a circular boss 9'), which limits the travel of the rod 3 in the opposite direction.

FIG. 5 shows in schematic fashion an arrangement within the chamber 4 for measuring the instantaneous pressure established therein with the plunger 6. Such arrangement, in which only one of the rods 3 is depicted, includes a piston 81 extending into the hydraulic medium (represented at 5) within the chamber 4, such piston 81 being associated with a suitable transducer 13 for converting indications of pressure picked up by the piston 18 into a proportional electrical signal on a pair of output leads 82. In the arrangement of FIG. 5, the transducer 13 is separated from and disposed opposite from the pressure-applying piston 6, and extends into the chamber 4 via an opening 83. Alternatively, and as indicated in FIG. 6, the transducer 13 may be made integral with the piston 6.

The arrangement of FIG. 6 is further provided with facilities for removing electrical excitation from the planar semiconductor devices which are cooled via the chamber 4 and the rods 3 whenever the pressure within the chamber 4, and thus the uniform contact pressure applied to the semiconductive elements falls below a predetermined value. Such arrangement is particularly advantageous when the semiconductive elements are in the form of thyratron-like elements 2' having control electrodes 91. In such case, the presence of insufficient pressure within the chamber 4 is effective to remove excitation from the control electrodes 91, thereby disabling the devices 2' at the conclusion of the then-current half-cycle of excitation of their respective semiconductive paths by suitable means (not shown).

In particular, the fail-safe facilities of FIG. 6 includes a two-input comparator 10, which exhibits an output 14" proportional in amplitude to the difference in the amplitudes of signal indications applied to its respective inputs 14 and 14'.

The input 14 of the comparator 10 is coupled to the output electrodes 82 of the transducer 13, thereby providing a test indication of the actual pressure within the chamber 4. The other input 14' of the comparator 10 is coupled to the output of an adjustable reference pressure indicator 92, whose output is adjusted to correspond to a desired value of pressure within the chamber 4 and thus a desired amount of contact pressure applied to the elements 2'.

The output 14' of the comparator 10 is coupled to the input of a threshold circuit 12, whose output is coupled to the control electrodes 91 of each of the elements 2'. The threshold circuit 12 is illustratively arranged to maintain excitation on the control electrodes 91 so long as the amplitude of excitaton applied to its input is below a predetermined value. When such value is exceeded (caused, i.e., when the amplitudes of excitation of the inputs 14 and 14' differ by a corresponding amount), the threshold circuit switches state to remove excitation from the control electrodes 91.

Thus, so long as the pressure in the chamber 4, referred to the output electrodes 82 of the transducer 13, remains within a predetermined deviation of the reference pressure set on the indicator 92, the amplitude at the output 14" of the comparator 10 will remain below the threshold level of the circuit 12. If the above-mentioned deviation exceeds the permissible value, however, the amplitude of the output 14" of the comparator 10 will exceed the threshold of the circuit 12, thereby disabling the semiconductive elements 2'.

In the foregoing, some illustrative arrangements of the invention have been described. Many variations and modifications will now occur to those skilled in the art. It is accordingly desired that the scope of the appended claims not be limited to the specific disclosure herein contained.

What is claimed is:

1. In an apparatus for simultaneously cooling a plurality of planar semiconductor devices, a common chamber containing a pressurized hydraulically compressible medium and having a plurality of aligned first openings in a bounary wall thereof, a plurality of parallel elongated rods individually extending outwardly from and slidably mounted within the respective first openings, the inner ends of the rods being in direct fluid pressure communication with the compressible medium, a plurality of heat sinks individually associated with the rods and having first and second opposed surfaces, the first surfaces of the heat sinks being engageable with corresponding surfaces of the respective semiconductive devices, means for individually and rigidly coupling the outer end of each rod to the second surface of the associated heat sink so that each resulting rod-heat sink assembly constitutes a rigid piston acted upon with the same pressure by the compressible medium, and means coupled to the interior of the chamber for varying the hydraulic pressure of the compressible medium within the chamber.

2. Apparatus as defined in claim 1, further comprising sealing means disposed between the outer periphery of each rod and the surrounding wall of the associated opening in the chamber.

3. Apparatus as defined in claim 2, in which the sealing means comprises a corrugated metal sleeve.

4. Apparatus as defined in claim 2, in which the sealing means comprises, in combination, means defining a first recess in the outer periphery of each rod, and an elastomeric ring disposed in each recess.

5. Apparatus as defined in claim 4, further comprising means defining a second recess in the outer periphery of each rod for receiving liquid metal, the second recess being axially spaced from the first recess.

6. Apparatus as defined in claim 1, further comprising a pair of limit stops individually connected to the inner and outer ends of each rod.

7. Apparatus as defined in claim 1, further comprising transducer means coupled to the interior of the chamber for detecting the actual pressure therein and for generating a first signal proportional to such actual pressure.

8. Apparatus as defined in claim 7, in which at least one of the semiconductor devices is a thyratron-like gating element having a control electrode, and in which the apparatus further comprises, in combination, comparison means having first and second inputs and an output exhibiting a signal proportional to the difference of the signal amplitudes applied to the first and second inputs, threshold-operated switching means, means for coupling the output of the transducer means to the first input of the comparator means, means for applying, to the second input of the comparator means, a second signal proportional to a desired value of pressure, means for coupling the output of the comparator means to the input of the switching means to change the state of the switching means when the output of the comparator means departs from a predetermined value in a first direction, and means for coupling the output of the switching means to the control electrode of the gating element.

* * * * *